United States Patent
Sekiya

(10) Patent No.: US 10,037,907 B1
(45) Date of Patent: Jul. 31, 2018

(54) FRAME UNIT TRANSFER SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/867,290

(22) Filed: Jan. 10, 2018

(30) Foreign Application Priority Data

Jan. 13, 2017 (JP) .................................. 2017-004421

(51) Int. Cl.
*H01L 21/687* (2006.01)
*H01L 21/677* (2006.01)
*H01L 21/683* (2006.01)

(52) U.S. Cl.
CPC .. *H01L 21/67724* (2013.01); *H01L 21/67778* (2013.01); *H01L 21/6836* (2013.01); *H01L 21/6875* (2013.01); *H01L 21/68742* (2013.01)

(58) Field of Classification Search
CPC ........... H01L 21/68741; H01L 21/6875; H01L 21/67778
See application file for complete search history.

(56) References Cited

U.S. PATENT DOCUMENTS

| 4,744,712 A * | 5/1988 | Mitchell | H01L 21/6776 414/940 |
| 2005/0269030 A1* | 12/2005 | Kent | H01L 21/67751 156/345.31 |
| 2011/0253037 A1* | 10/2011 | Tsunekawa | H01L 21/68742 118/50 |

FOREIGN PATENT DOCUMENTS

JP 09-27543 1/1997

* cited by examiner

*Primary Examiner* — Gerald McClain
(74) *Attorney, Agent, or Firm* — Greer Burns & Crain Ltd.

(57) ABSTRACT

Disclosed herein is a frame unit transfer system for transferring a frame unit formed by supporting a workpiece through an adhesive tape to an annular frame, the frame unit being stored in a tray during transfer. The tray includes a bottom portion having a mounting surface for mounting the frame unit thereon during transfer, a side wall standing from the outer edge of the bottom portion, an inlet/outlet opening formed through the side wall so as to allow the pass of the frame unit, an abutting member provided on the bottom portion at the inlet/outlet opening for preventing the frame unit mounted on the mounting surface of the bottom portion from undesirably projecting from the inlet/outlet opening during transfer, and a plurality of openings formed at predetermined target positions in the bottom portion in relation to the frame unit.

2 Claims, 6 Drawing Sheets

FRAME UNIT TRANSFER SYSTEM

BACKGROUND OF THE INVENTION

Field of the Invention

The present invention relates to a frame unit transfer system.

Description of the Related Art

In a process of processing various kinds of plate-shaped workpieces such as semiconductor wafers and packaged substrates, it is known in the art to use a technique of transferring a frame unit formed by supporting a workpiece through an adhesive tape such as a dicing tape to an annular frame having an inside opening in the condition where the workpiece is positioned in the inside opening of the annular frame. For example, Japanese Patent Laid-Open No. 1997-027543 discloses a technique of setting a wafer cassette in a cassette setting area formed in each apparatus, storing a plurality of workpieces each having the form of the above-mentioned frame unit into the wafer cassette to be set in the cassette setting area, and taking each frame unit out of the wafer cassette in processing each wafer.

SUMMARY OF THE INVENTION

In the case of storing a plurality of frame units in a cassette as described in Japanese Patent Laid-Open No. 1997-027543, the transfer of each frame unit between process steps is performed on the cassette-by-cassette basis. Accordingly, there is a case that until the processing of all the frame units stored in the cassette is completed in the previous process step, the transfer of the cassette to the next process step must be awaited, causing a low efficiency of production. This low production efficiency may be caused irrespective of whether the transfer of the cassette is manually performed by an operator or automatically performed by a robot or the like. In the case that each frame unit completed in processing is manually transferred by the operator on the one-by-one basis, it is unnecessary to wait for the completion of the processing of all the frame units stored in the cassette. However, there is a problem such that a load on the operator may be increased to cause the requirement for increasing the number of operators and accordingly cause an increase in cost.

It is therefore an object of the present invention to provide a frame unit transfer system which can automatically transfer each frame unit completed in processing in the previous step to the next step without an increase in load on the operator, thereby improving the efficiency of production.

In accordance with an aspect of the present invention, there is provided a frame unit transfer system for transferring a frame unit formed by supporting a workpiece through an adhesive tape to an annular frame having an inside opening in the condition where the workpiece is positioned in the inside opening of the annular frame, the frame unit transfer system including a tray for storing the frame unit in transferring the frame unit, a conveyor for moving the tray storing the frame unit, a tray support member provided adjacent to the conveyor for supporting the tray, and a tray transfer member for transferring the tray between the conveyor and the tray support member, the tray including a bottom portion having a mounting surface for mounting the frame unit thereon during transfer, a side wall standing from the outer edge of the bottom portion, an inlet/outlet opening formed through the side wall so as to allow the pass of the frame unit, an abutting member provided on the bottom portion at the inlet/outlet opening for preventing the frame unit mounted on the mounting surface of the bottom portion from undesirably projecting from the inlet/outlet opening during transfer, and a plurality of openings formed at predetermined target positions in the bottom portion in relation to the frame unit, the tray support member having a plurality of pushing members adapted to be inserted through the plurality of openings of the bottom portion of the tray, wherein when the pushing members are inserted through the openings to enter the tray storing the frame unit, the frame unit mounted on the mounting surface of the bottom portion of the tray is pushed up by the pushing members to a vertical position higher than the height of the abutting member, so that the frame unit raised at the vertical position can be passed through the inlet/outlet opening.

Preferably, the tray further includes a top portion opposed to the bottom portion to thereby define a storing space for storing the frame unit, the top portion having restriction means for restricting the movement of another tray stacked on the upper surface of the top portion of the tray.

In the frame unit transfer system according to the present invention, the tray storing the frame unit is transferred by the conveyor and further transferred from the conveyor to the tray support member adjacent to the conveyor by the tray transfer member. Accordingly, the frame unit stored in the tray can be automatically transferred on the one-by-one basis. As a result, the waiting time on the cassette-by-cassette basis can be eliminated and it can be greatly reduced owing to the transfer on the tray-by-tray basis, so that the number of operators can be reduced. Accordingly, after the processing of the frame unit in one step is finished, the frame unit can be sequentially transferred to the next processing step without an increase in load on the operator, thereby improving the efficiency of production.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
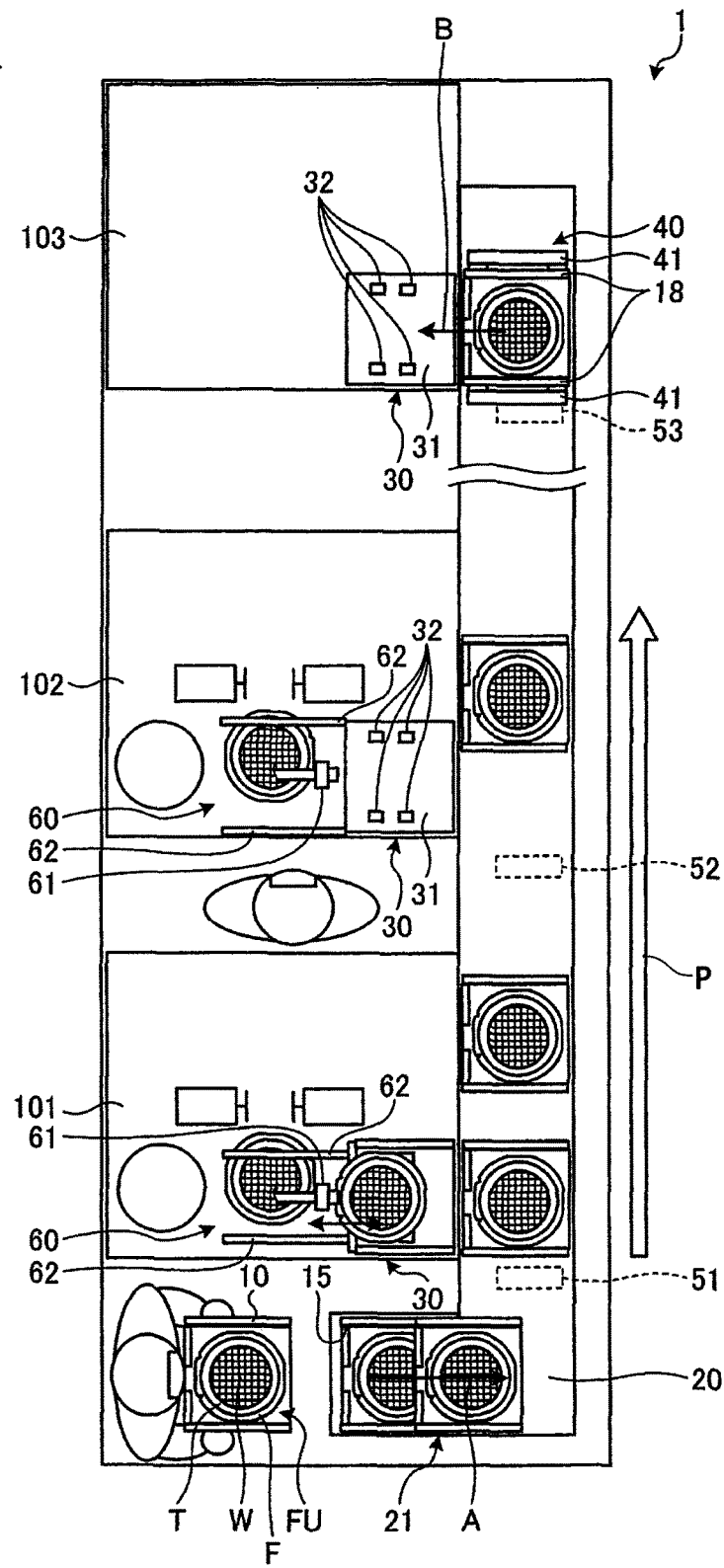
FIG. 1 is a schematic plan view depicting a frame unit transfer system according to a preferred embodiment of the present invention.

FIG. 1 is a schematic plan view depicting a frame unit transfer system 1 according to a preferred embodiment of the present invention. The frame unit transfer system 1 is a system for transferring a wafer W as a workpiece among a first processing apparatus 101 for performing a first processing step to the wafer W, a second processing apparatus 102 for performing a second processing step to the wafer W, and a third processing apparatus 103 for performing a third processing step to the wafer W.

The wafer W as a workpiece is a disk-shaped semiconductor wafer or optical device wafer formed of silicon, sapphire, or gallium arsenide, for example, as a base material. The wafer W has a front side WS, and a plurality of crossing division lines L are formed on the front side WS of the wafer W (see FIG. 2). A plurality of separate regions are defined by the crossing division lines L on the front side WS of the wafer W, and a plurality of devices D are formed in these separate regions (see FIG. 2). Examples of each device D include an IC (integrated circuit), LSI (large-scale integrated circuit), and MEMS (micro electro mechanical systems). The wafer W is not limited to a semiconductor wafer or optical device wafer, but any other kinds of plate-shaped substrates may be used. Examples of such plate-shaped substrates include an inorganic material substrate of ceramics, glass, sapphire, etc., ductile material substrate of metal, resin, etc., and various work material substrates.

As depicted in FIG. 1, the wafer W is fixed through an adhesive tape T to an annular frame F having an inside opening F1 (see FIG. 2) in the condition where the wafer W is positioned in the inside opening F1 of the annular frame F. More specifically, a peripheral portion of the adhesive tape T is attached to the annular frame F, and a central portion of the adhesive tape T is attached to the back side of the wafer W. Thus, the wafer W, the adhesive tape T, and the annular frame F are united together to form a frame unit FU. In the condition where the wafer W as a workpiece is supported through the adhesive tape T to the annular frame F to form the frame unit FU, the frame unit FU is transferred from the first processing apparatus 101 through the second processing apparatus 102 to the third processing apparatus 103. Further, the wafer W of the frame unit FU is processed in the first processing apparatus 101, the second processing apparatus 102, or the third processing apparatus 103. Further, a bar code 5 (see FIG. 2) is provided on the front side WS of the wafer W, wherein the bar code 5 indicates the kinds, order, etc. of the processing to be performed to the wafer W.

In this preferred embodiment, the first processing apparatus 101 and the second processing apparatus 102 are each a cutting apparatus for cutting the wafer W along the division lines L to divide the wafer W into a plurality of device chips. The third processing apparatus 103 is a die bonder. However, the first, second, and third processing apparatuses 101, 102, and 103 may be any apparatus for processing the wafer W in the form of the frame unit FU.

As depicted in FIG. 1, the frame unit transfer system 1 for transferring the frame unit FU among the first processing apparatus 101, the second processing apparatus 102, and the third processing apparatus 103 includes a tray 10 for storing the frame unit FU in transferring the same, a conveyor 20 for moving the tray 10 storing the frame unit FU, a tray support member 30 provided adjacent to the conveyor 20 for supporting the tray 10, a tray transfer member 40 for transferring the tray 10 between the conveyor 20 and the tray support member 30, a first bar code reader 51, a second bar code reader 52, and a third bar code reader 53.

Figure 2:
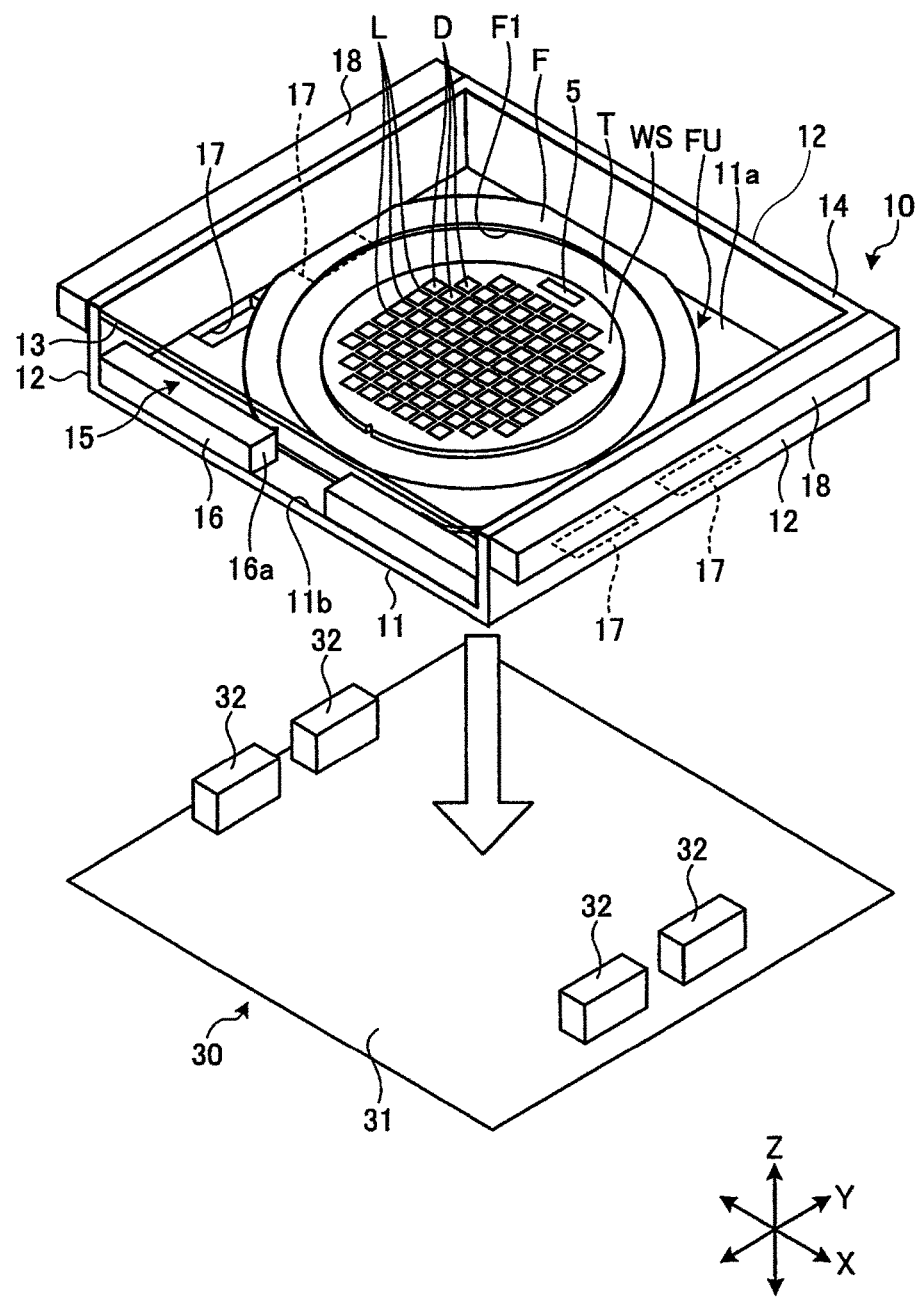
FIG. 2 is a perspective view depicting a tray and a tray support member in this preferred embodiment, wherein a frame unit is stored in the tray.

FIG. 2 is a perspective view depicting the tray 10 and the tray support member 30. As depicted in FIG. 2, the tray 10 is a housing having a rectangular prismatic shape. That is, the tray 10 has a bottom portion 11, three side walls 12, and a top plate 13. The shape of the tray 10 may be a cylindrical shape. The tray 10 has an inside space for storing a single frame unit FU. The bottom portion 11 of the tray 10 has a mounting surface 11a for mounting the frame unit FU thereon during transfer. The three side walls 12 stand from the outer edge of the bottom portion 11. More specifically, the three side walls 12 stand from three of the four sides of the rectangular bottom portion 11 in such a manner as to form a U-shape as viewed in plan. The top plate 13 is a transparent cover member formed of a transparent resin such as polycarbonate. The outer edge of the top plate 13 is engaged with the inner surface of each side wall 12 near its upper end. The top plate 13 may be fixed to the side walls 12 by using a fastener or adhesive, for example. The upper end surface of each side wall 12 and the top plate 13 constitute a top portion 14 of the tray 10. In other words, the tray 10 has the top portion 14 including the upper end surface of each side wall 12 and the top plate 13 and opposed to the bottom portion 11 with the inside space for storing the frame unit FU being defined therebetween.

The tray 10 has an inlet/outlet opening 15 for allowing the pass of the frame unit FU. As depicted in FIG. 2, the inlet/outlet opening 15 is formed as a front opening left by not forming the side wall 12 at the front edge 11b of the bottom portion 11 as the remaining one side of the four sides of the rectangular bottom portion 11. Accordingly, the frame unit FU is adapted to be inserted through the inlet/outlet opening 15 into the tray 10 in a substantially horizontal direction and also adapted to be drawn from the tray 10 through the inlet/outlet opening 15. In the following description, the direction of inserting and drawing the frame unit FU with respect to the tray 10 (i.e., Y direction in FIG. 2) will be referred to as "longitudinal direction of the tray 10," and the direction perpendicular to this longitudinal direction of the tray 10 and also perpendicular to a vertical direction (i.e., Z direction in FIG. 2) will be referred to as "lateral direction of the tray 10." The lateral direction of the tray 10 corresponds to X direction in FIG. 2.

The tray 10 has an abutting member 16 provided on the bottom portion 11 at the inlet/outlet opening 15. The abutting member 16 extends along the front edge 11b of the bottom portion 11 over the entire length of the inlet/outlet opening 15 in the lateral direction of the tray 10 between the opposed side walls 12 in the condition where a central cutout 16a is formed at the laterally central portion of the abutting member 16 as depicted in FIG. 2. The abutting member 16 projects upward in the vertical direction to a position higher than the frame unit FU mounted on the mounting surface 11a of the bottom portion 11. With this height of the abutting member 16, the lower area of the inlet/outlet opening 15 is closed by the abutting member 16 except the central cutout 16a.

The tray 10 has a plurality of openings 17 formed at predetermined target positions in the bottom portion 11 in relation to the frame unit FU. The target positions in the bottom portion 11 in relation to the frame unit FU are predetermined in such a manner that each opening 17 overlaps at least a part of the annular frame F of the frame unit FU mounted on the mounting surface 11a of the bottom portion 11 as viewed in plan. Each opening 17 is a through hole extending through the thickness of the bottom portion 11. While each opening 17 is rectangular (oblong) in shape in this preferred embodiment, each opening 17 may be circular or elliptical in shape, for example. More specifically, the plural openings 17 are four openings formed symmetrically at the opposite end positions of the bottom portion 11 in the lateral direction of the tray 10 in such a manner that every two of the four openings are spaced from each other in the longitudinal direction of the tray 10.

Further, the tray 10 has a pair of projecting members 18 formed on the outer surfaces of the opposed side walls 12 at their upper portions. Each projecting member 18 extends in the longitudinal direction of the tray 10 along the upper edge of the corresponding side wall 12 over the entire length thereof and projects from the outer surface of the corresponding side wall 12 in the lateral direction of the tray 10. Each projecting member 18 is adapted to be caught by a hook 41 (see FIG. 1) of the tray transfer member 40 to be hereinafter described. While each projecting member 18 is formed at the upper portion of the corresponding side wall 12 in this preferred embodiment, each projecting member 18 may be formed near a vertically central portion of the corresponding side wall 12, provided that each projecting member 18 can be caught by the hook 41.

The conveyor 20 is a belt conveyor, for example, and it can move the tray 10 in the direction indicated by a hollow arrow P in FIG. 1. At a start position of the conveyor 20, a tray setting portion 21 is provided adjacent to the conveyor 20, wherein a plurality of trays 10 can be stacked and set on the tray setting portion 21. As depicted in FIG. 1, the conveyor 20 is provided adjacent to the first processing apparatus 101, the second processing apparatus 102, and the third processing apparatus 103. More specifically, the conveyor 20 extends straight in one direction, and the first, second, and third processing apparatuses 101, 102, and 103 are located on one side of the conveyor 20. The shape of the conveyor 20 is not limited to that depicted in FIG. 1. Further, the location of the first, second, and third processing apparatuses 101, 102, and 103 is also not limited to that depicted in FIG. 1. For example, the conveyor 20 may be curved. Further, the first, second, and third processing apparatuses 101, 102, and 103 may be located on both sides of the conveyor 20.

The tray support member 30 is provided in the first, second, and third processing apparatuses 101, 102, and 103 at a position adjacent to the conveyor 20. The tray support member 30 is rectangular in shape like the bottom portion 11 of each tray 10 and has substantially the same size as that of the bottom portion 11. The tray support member 30 has a mounting surface 31 for mounting the bottom portion 11 of each tray 10. As depicted in FIG. 2, the tray support member 30 has a plurality of pushing members 32 projecting from the mounting surface 31 in a vertical direction. These plural pushing members 32 are formed at the positions such that when the tray 10 is mounted on the mounting surface 31 of the tray support member 30, the pushing members 32 are aligned with the openings 17 of the bottom portion 11 of the tray 10 as viewed in plan. Each pushing member 32 is rectangular in shape as similar to the shape of each opening 17 and has a size such that each pushing member 32 can be inserted through the corresponding opening 17. In the condition where each pushing member 32 is inserted through the corresponding opening 17, each pushing member 32 projects up to the same height as that of the abutting member 16 of the tray 10 (see FIG. 4). As a modification, each pushing member 32 may project up to a vertical position higher than the height of the abutting member 16 in the condition where each pushing member 32 is inserted through the corresponding opening 17.

As depicted in FIG. 1, the tray transfer member 40 is a hook type transfer mechanism having a pair of hooks 41 capable of catching the pair of projecting members 18 provided on the opposed side walls 12 of the tray 10. While the tray transfer member 40 is depicted in FIG. 1 so as to be located in the vicinity of the third projecting apparatus 103, similar tray transfer members 40 are also provided in the vicinity of the tray setting portion 21, the first processing apparatus 101, and the second processing apparatus 102. More specifically, one of the tray transfer members 40 is movably located between the tray setting portion 21 and the conveyor 20. Another one of the tray transfer members 40 is movably located between the tray support member 30 of the first processing apparatus 101 and the conveyor 20. Another one of the tray transfer members 40 is movably located between the tray support member 30 of the second processing apparatus 102 and the conveyor 20. The other one of the tray transfer members 40 is movably located between the tray support member 30 of the third processing apparatus 103 and the conveyor 20. Thus, each tray transfer member 40 functions to transfer between the conveyor 20 and the corresponding tray support member 30. As a modification, each tray transfer member 40 may be a vacuum type transfer mechanism capable of holding the tray 10 under suction by sucking the upper surface of each projecting member 18 or the upper surface of the top portion 14 (i.e., the upper surface of the top plate 13 and the upper end surface of each side wall 12). In the case of sucking the upper surface of the top portion 14 (i.e., the upper surface of the top plate 13 and the upper end surface of each side wall 12), each projecting member 18 may be omitted from the tray 10.

The first bar code reader 51, the second bar code reader 52, and the third bar code reader 53 are located on the path of movement of the conveyor 20 and above the conveyor 20. As depicted in FIG. 1, the first bar code reader 51 is located upstream of the first processing apparatus 101. The second bar code reader 52 is located upstream of the second processing apparatus 102. The third bar code reader 53 is located upstream of the third processing apparatus 103. The first, second, and third bar code readers 51, 52, and 53 function to scan the bar code 5 provided on the wafer W stored in the tray 10 and then transmit the information on the processing of the wafer W, such as the kinds and the order of the processing steps to be performed to the wafer W, to a control section (not depicted) for controlling the whole of the frame unit transfer system 1.

The first, second, and third processing apparatuses 101, 102, and 103 are provided with a frame unit handling mechanism 60 for taking the frame unit FU out of the tray 10 supported on the tray support member 30 before processing and also storing the frame unit FU into the tray 10 supported on the tray support member 30 after processing. While the frame unit handling mechanisms 60 provided in the first and second processing apparatuses 101 and 102 are depicted in FIG. 1, the frame unit handling mechanism 60 is similarly provided in the third processing apparatus 103. As depicted in FIG. 1, each frame unit handling mechanism 60 has a grip arm 61 capable of gripping the frame unit FU and a pair of guide rails 62 for slidably supporting the frame unit FU.

The grip arm 61 functions to grip the annular frame F of the frame unit FU and then move the frame unit FU with respect to the tray 10 in such a manner that the frame unit FU slides on the pair of guide rails 62. The pair of guide rails 62 are movable toward and away from each other. In slidably supporting the frame unit FU on the guide rails 62, the guide rails 62 are moved toward a working position depicted in the first processing apparatus 101 in FIG. 1. In moving the frame unit FU to a chuck table (not depicted) or the like, the guide rails 62 are moved away from each other to a standby position depicted in the second processing apparatus 102 in FIG. 1. In this standby position, the frame unit FU can be mounted on the chuck table by using another holding mechanism (not depicted), wherein the chuck table is located between the guide rails 62 on the lower side thereof. As a modification, each frame unit handling mechanism 60 may be an existing mechanism to be used in handling a frame unit stored in a cassette in the case of using a processing apparatus having cassette equipment.

There will now be described a general flow of the transfer operation of the frame unit FU by the frame unit transfer system 1. As depicted in FIG. 1, an operator sets a plurality of trays 10 in a stacked condition on the tray setting portion 21, wherein the frame unit FU including the wafer W to be processed is stored in each tray 10. At this time, the inlet/outlet opening 15 of each tray 10 is oriented to the same side as the side of the conveyor 20 where the first, second, and third processing apparatuses 101, 102, and 103 are located. Thereafter, as depicted by a solid arrow A in FIG. 1, one of the trays 10 set on the tray setting portion 21 is transferred to the conveyor 20 by operating the tray transfer member 40. The tray 10 transferred to the conveyor 20 is moved to the downstream side by the conveyor 20.

When the tray 10 on the conveyor 20 is moved to the position below the first bar code reader 51, the second bar code reader 52, or the third bar code reader 53, the bar code 5 provided on the wafer W in the tray 10 is scanned by the first bar code reader 51, the second bar code reader 52, or the third bar code reader 53, and the information on the wafer W is transmitted to the control section (not depicted). Thereafter, the control section determines whether or not the wafer W in the tray 10 is required to be processed by the first processing apparatus 101, the second processing apparatus 102, or the third processing apparatus 103. In the case that the control section determines that the wafer W in the tray 10 is not required to be processed by the first processing apparatus 101, the second processing apparatus 102, or the third processing apparatus 103, the tray 10 is not transferred to the first processing apparatus 101, the second processing apparatus 102, or the third processing apparatus 103, but further transferred to the downstream side by the conveyor 20. In this preferred embodiment, however, all of the frame units FU are processed by the third processing apparatus 103 as a die bonder.

In the case that the control section determines that the wafer W in the tray 10 is required to be processed by the first processing apparatus 101, the second processing apparatus 102, or the third processing apparatus 103, the movement of the conveyor 20 is once stopped at the time the tray 10 on the conveyor 20 has reached the position opposed to the tray support member 30 provided in the first processing apparatus 101, the second processing apparatus 102, or the third processing apparatus 103. The determination of whether or not the tray 10 has reached the position opposed to the tray support member 30 may be effected by calculating the distance from the position of each bar code reader to the tray 10 according to the moving speed of the conveyor 20 or by using a sensor (not depicted) for detecting the position of the tray 10. For example, as indicated by a solid arrow B in FIG. 1, the tray 10 is next transferred to the tray support member 30 by operating the tray transfer member 40. In the case that the moving speed of the conveyor 20 is sufficiently low, the movement of the conveyor 20 may not be stopped, but the tray 10 may be transferred to the tray support member 30 by the tray transfer member 40 during the movement of the conveyor 20.

Thereafter, the frame unit handling mechanism 60 is operated to take the frame unit FU out of the tray 10 supported on the tray support member 30. Thereafter, the frame unit FU is subjected to the processing by the first processing apparatus 101, the second processing apparatus 102, or the third processing apparatus 103. Thereafter, the frame unit FU is stored again into the tray 10 by operating the frame unit handling mechanism 60. The operation of the frame unit handling mechanism 60 will now be hereinafter described in detail. In this manner, the wafer W of each frame unit FU can be processed as required in the first processing apparatus 101, the second processing apparatus 102, or the third processing apparatus 103. After completing the processing of the wafer W, the frame unit FU is stored again into the tray 10, and the tray 10 is next returned to the conveyor 20 by the tray transfer member 40. At this time, the movement of the conveyor 20 is once stopped. However, in the case that the moving speed of the conveyor 20 is sufficiently low, the tray 10 may be transferred to the conveyor 20 by the tray transfer member 40 without stopping the movement of the conveyor 20.

After finishing the processing of the wafer W in the third processing apparatus 103, the operator directly transfers the frame unit FU from the third processing apparatus 103 to another piece of equipment. As a modification, another tray setting portion for setting the tray 10 storing the frame unit FU after processing and another tray transfer member corresponding to this tray setting portion may be provided on the most downstream side of the conveyor 20. In this case, the frame unit FU after processing may be returned to the tray 10 from the third processing apparatus 103 to the conveyor 20, and the tray 10 may be next set on this tray setting portion. Particularly in the case that the third processing apparatus 103 is any processing apparatus other than a die bonder and the frame unit FU may not be processed in the third processing apparatus 103, it is preferable to provide such a tray setting portion for setting the tray 10 storing the frame unit FU after processing and a tray transfer member corresponding to this tray setting portion, on the most downstream side of the conveyor 20.

Figure 3:
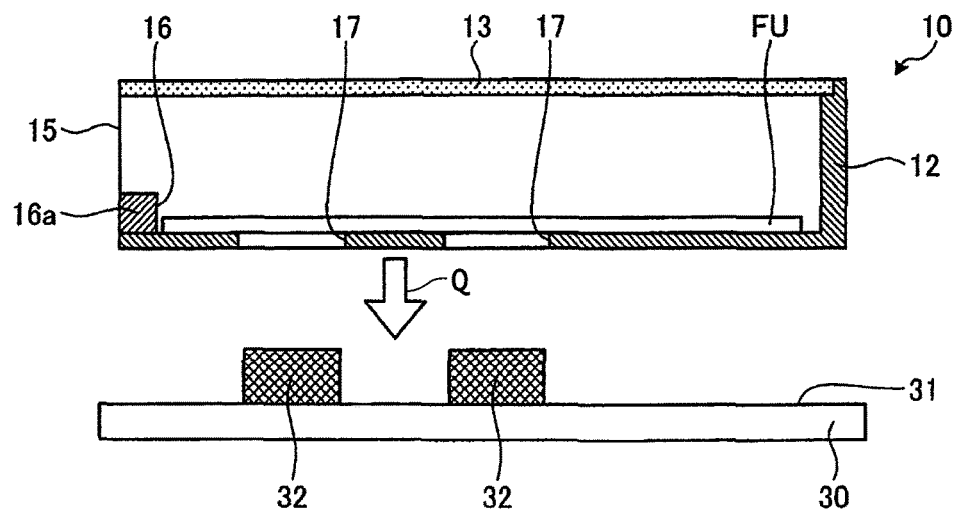
FIG. 3 is a sectional view depicting a manner of setting the tray storing the frame unit on the tray support member.
Figure 4:
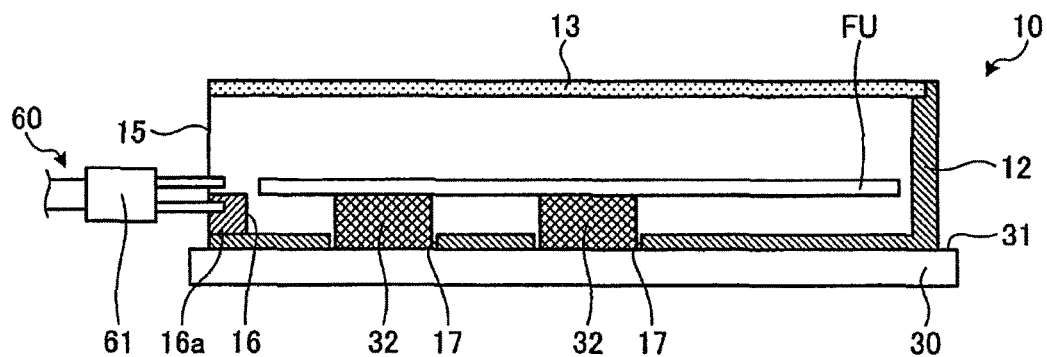
FIG. 4 is a sectional view depicting a condition that the tray storing the frame unit has been set on the tray support member.
Figure 5:
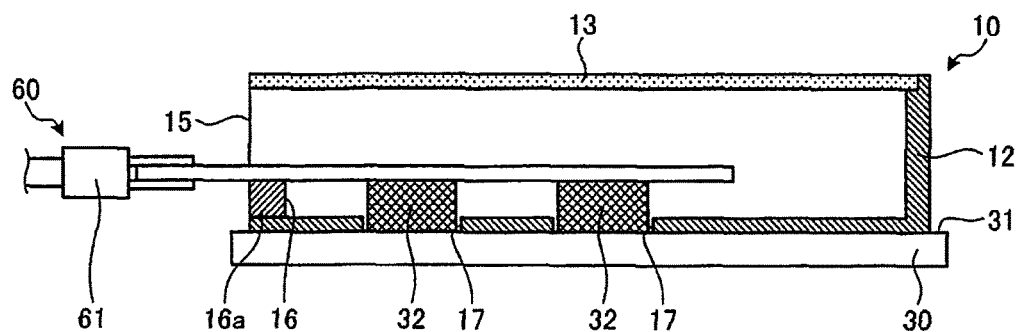
FIG. 5 is a sectional view depicting a manner of taking the frame unit out of the tray or storing the frame unit into the tray.

There will now be described the operation of taking the frame unit FU out of the tray 10 supported on the tray support member 30 and also storing the frame unit FU into the tray 10 supported on the tray support member 30, with reference to FIGS. 3 to 5. FIG. 3 is a sectional view depicting a manner of setting the tray 10 storing the frame unit FU on the tray support member 30. FIG. 4 is a sectional view depicting a condition that the tray 10 storing the frame unit FU has been set on the tray support member 30. FIG. 5 is a sectional view depicting a manner of taking the frame unit FU out of the tray 10 or storing the frame unit FU into the tray 10.

As depicted in FIG. 3, the tray transfer member 40 (not depicted in FIG. 3) is operated to move the tray 10 to the position directly above the tray support member 30 in such a manner that the openings 17 of the tray 10 are aligned with the pushing members 32 of the tray support member 30. Thereafter, the tray 10 is lowered by the tray transfer member 40 as depicted by a hollow arrow Q in FIG. 3 and then placed on the mounting surface 31 of the tray support member 30. As described above, each pushing member 32 can be inserted through the corresponding opening 17, and in the condition where each pushing member 32 is inserted through the corresponding opening 17, each pushing member 32 projects up to the same height as that of the abutting member 16 of the tray 10. That is, as depicted in FIG. 4, the tray support member 30 operates in such a manner that the pushing members 32 of the tray support member 30 are inserted through the openings 17 of the tray 10 to enter the tray 10 and thereby push up the frame unit FU from the mounting surface 31 to a vertical position higher than the height of the abutting member 16. In this manner, the tray 10 is supported by the tray support member 30 and at the same time, the frame unit FU in the tray 10 is raised to the position where the frame unit FU can be passed through the inlet/outlet opening 15 of the tray 10 (as depicted in FIGS. 4 and 5).

After the frame unit FU is raised to the position where it can be passed through the inlet/outlet opening 15 of the tray 10 as depicted in FIG. 4, the grip arm 61 of the frame unit handling mechanism 60 provided in the first, second, and third processing apparatuses 101, 102, and 103 is inserted from the inlet/outlet opening 15 into the tray 10. As described above, the abutting member 16 formed at the inlet/outlet opening 15 has the central cutout 16a. Accordingly, the grip arm 61 can be inserted through the central cutout 16a of the abutting member 16 into the tray 10. With this configuration, it is unnecessary to increase the height of each pushing member 32 or the size of the inlet/outlet opening 15 for the purpose of avoiding the interference of the abutting member 16 and the grip arm 61. Accordingly, an increase in size of the tray 10 can be suppressed.

Thereafter, as depicted in FIG. 5, the grip arm 61 is operated to grip the frame unit FU and then draw the frame unit FU in such a manner that the frame unit FU slides on the upper surfaces of the pushing members 32. Thus, the frame unit FU is taken out of the tray 10 through the inlet/outlet opening 15. Accordingly, the frame unit FU can be transferred to the first processing apparatus 101, the second processing apparatus 102, or the third processing apparatus 103, thereby processing the wafer W of the frame unit FU. During processing of the wafer W, the tray 10 remains supported on the tray support member 30.

After completing the processing of the wafer W, the frame unit FU is stored again into the tray 10 in the following manner. As depicted in FIG. 5, the frame unit FU is gripped by the grip arm 61 and then inserted through the inlet/outlet opening 15 into the tray 10 in such a manner that the frame unit FU slides on the upper surfaces of the pushing members 32. Accordingly, the frame unit FU is mounted on the upper surfaces of the pushing members 32 of the tray support member 30 as depicted in FIG. 4. Thereafter, the tray transfer member 40 (not depicted in FIG. 3) is operated to lift the tray 10, thereby obtaining the condition depicted in FIG. 3. As a result, the frame unit FU is mounted on the mounting surface 11a of the tray 10. Thereafter, the tray 10 is returned to the conveyor 20 by the tray transfer member 40.

As described above, the frame unit transfer system 1 according to this preferred embodiment is configured in such a manner that the tray 10 storing the frame unit FU is transferred by the conveyor 20 and further transferred from the conveyor 20 to the tray support member 30 by the tray transfer member 40, wherein the tray support member 30 is located adjacent to the conveyor 20. Accordingly, by providing the tray support member 30 in the first, second, and third processing apparatuses 101, 102, and 103 as in this preferred embodiment, the frame unit FU stored in the tray 10 can be automatically transferred to the first, second, and third processing apparatuses 101, 102, and 103. As a result, the waiting time on the cassette-by-cassette basis can be eliminated and it can be greatly reduced owing to the transfer on the tray-by-tray basis, so that the number of operators can be reduced. Accordingly, after the processing of the frame unit FU in one step is finished, the frame unit FU can be sequentially transferred to the next processing step without an increase in load on the operator, thereby improving the efficiency of production.

The tray 10 has the abutting member 16 provided at the inlet/outlet opening 15 for allowing the pass of the frame unit FU in such a manner that the lower area of the inlet/outlet opening 15 is closed by the abutting member 16. That is, the abutting member 16 functions to prevent the frame unit FU mounted on the bottom portion 11 from undesirably projecting from the inlet/outlet opening 15 of the tray 10. Accordingly, it is possible to prevent the problem such that while the tray 10 storing the frame unit FU is being transferred by the conveyor 20 or the tray transfer member 40, the frame unit FU may fall out of the tray 10 from the inlet/outlet opening 15. As a result, the efficiency of the processing of the frame unit FU can be further improved. Further, possible damage to the frame unit FU due to falling from the tray 10 can also be prevented.

The tray 10 has the plural openings 17 formed at the predetermined target positions in the bottom portion 11 in relation to the frame unit FU, and the tray support member 30 has the plural pushing members 32 corresponding to the plural openings 17 of the tray 10. That is, in setting the tray 10 on the tray support member 30, the pushing members 32 of the tray support member 30 are inserted through the openings 17 of the tray 10 to enter the tray 10 and push up the frame unit FU from the mounting surface 11a of the bottom portion 11. Accordingly, the frame unit FU is raised to a vertical position higher than the height of the abutting member 16 by the pushing members 32, wherein this vertical position is the position where the frame unit FU can be passed through the inlet/outlet opening 15. Thus, when the tray 10 is supported on the tray support member 30, the frame unit FU stored in the tray 10 is automatically raised by the pushing members 32 to the position higher than the height of the abutting member 16. Accordingly, although the abutting member 16 is formed at the inlet/outlet opening 15 of the tray 10, the frame unit FU can be easily taken out of the tray 10 or stored into the tray 10 through the inlet/outlet opening 15.

While the tray 10 is transferred by the conveyor 20 on the one-by-one basis in this preferred embodiment, a plurality of trays 10 may be transferred in a stacked condition by the conveyor 20. While the tray support member 30 is provided in the first, second, and third processing apparatuses 101, 102, and 103 in this preferred embodiment, the tray support member 30 may be provided adjacent to the first, second, and third processing apparatuses 101, 102, and 103, provided that the frame unit FU in the tray 10 supported on the tray support member 30 can be automatically transferred to the first, second, and third processing apparatuses 101, 102, and 103.

In this preferred embodiment, the plural openings 17 of the tray 10 are the four openings formed symmetrically at the opposite end positions of the bottom portion 11 in the lateral direction of the tray 10 in such a manner that every two of the four openings are spaced from each other in the longitudinal direction of the tray 10. This arrangement is intended to suppress a shock to the frame unit FU in inserting each pushing member 32 of the tray support member 30 through the corresponding opening 17 to push up the frame unit FU. However, the position and number of the openings 17 are not limited. That is, the openings 17 may be formed at any positions, provided that the frame unit FU can be stably pushed up by the pushing members 32 to the position where the frame unit FU can be passed through the inlet/outlet opening 15. Further, at least one opening 17 may be formed in the bottom portion 11 of the tray 10. Further, it is essential that the pushing members 32 of the tray support member 30 are formed at the positions corresponding to the positions of the openings 17.

In this preferred embodiment, the abutting member 16 of the tray 10 extends along the front edge 11b of the bottom portion 11 and has the central cutout 16a at the lateral center of the tray 10. However, the central cutout 16a may be omitted from the abutting member 16, provided that the grip arm 61 of the frame unit handling mechanism 60 can be inserted through the inlet/outlet opening 15 into the tray 10 without the interference between the grip arm 61 and the abutting member 16 and can grip the frame unit FU stored in the tray 10. Further, the abutting member 16 may be modified in configuration, provided that it can prevent undesirable projection of the frame unit FU from the inlet/outlet opening 15. A plurality of rods are formed as the abutting member 16 so as to be arranged at given intervals along the front edge 11b of the bottom portion 11.

Figure 6:
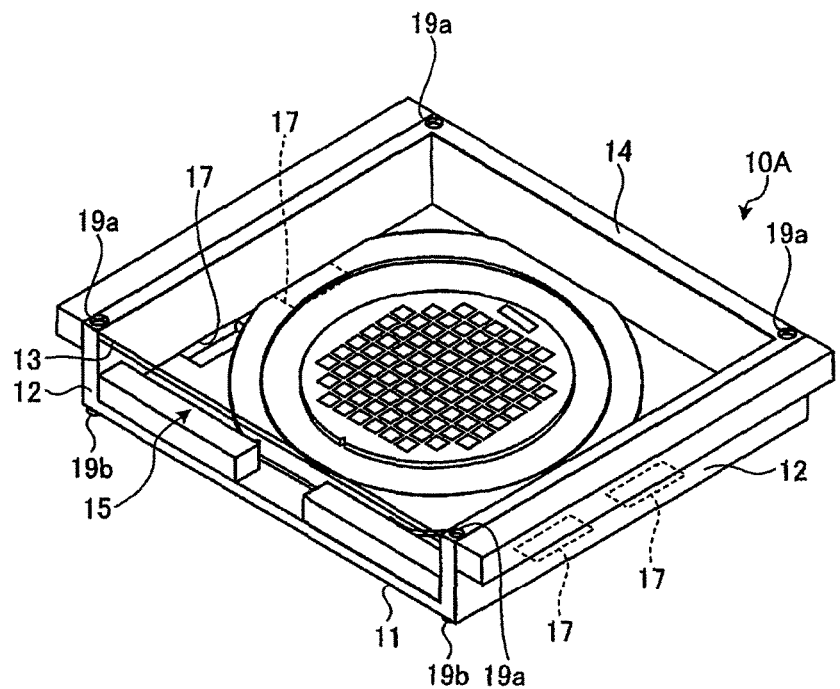
FIG. 6 is a perspective view depicting a tray according to a modification.
Figure 7:
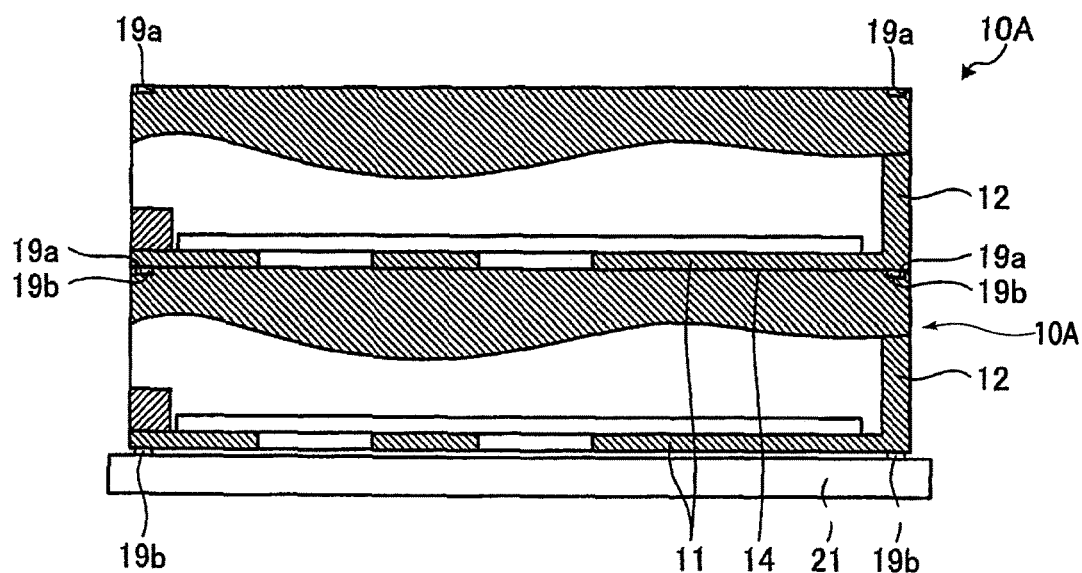
FIG. 7 is a sectional view depicting a condition where a plurality of trays are stacked in the modification depicted in FIG. 6.

FIG. 6 is a perspective view depicting a tray 10A according to a modification, and FIG. 7 is a sectional view depicting a condition where a plurality of trays 10A are stacked. As depicted in FIGS. 6 and 7, the tray 10A according to this modification has a plurality of recesses 19a formed on the upper surface of the top portion 14 so as to be recessed vertically downward. More specifically, the plural recesses 19a are four recesses formed at the four corners of the tray 10 on the upper end surfaces of the side walls 12. Further, as depicted in FIGS. 6 and 7, a plurality of projections 19b are formed on the lower surface of the bottom portion 11 of the tray 10A. More specifically, the plural projections 19b are four projections formed at the four corners of the tray 10A on the lower surface of the bottom portion 11 in such a manner that the plural projections 19b are aligned with the plural recesses 19a as viewed in plan. Each recess 19a is engageable with the corresponding projection 19b in the stacked condition of the trays 10A. The other configuration of the tray 10A is similar to that of the tray 10, and the description thereof will be omitted herein.

In the case of stacking the two trays 10A in such a manner that the lower surface of the bottom portion 11 of the upper tray 10A is mounted on the upper surface of the top portion 14 of the lower tray 10A, the plural projections 19b of the upper tray 10A are engaged with the plural recesses 19a of the lower tray 10A as depicted in FIG. 7. Accordingly, undesirable movement of the upper tray 10A relative to the lower tray 10A in the planar direction of the top portion 14 of the lower tray 10A can be restricted. In other words, the plural recesses 19a and the plural projections 19b function as restriction means for restricting the movement of the upper tray 10A in the condition where the upper tray 10A is stacked on the upper surface of the top portion 14 of the lower tray 10A. As a result, the plural trays 10A can be stably stacked. For example, the plural trays 10A can be stably set in a stacked condition on the tray setting portion 21. Further, the operator can stably transfer the plural trays 10A stacked. Further, the plural trays 10A stacked can be stably transferred on the conveyor 20.

While the four recesses 19a are formed on the upper end surfaces of the side walls 12 of the tray 10A in this modification depicted in FIGS. 6 and 7, at least one recess 19a may be formed on the upper surface of the top portion 14 inclusive of the upper surface of the top plate 13 of the tray 10A. In this case, at least one projection 19b may be formed on the lower surface of the bottom portion 11 at the position corresponding to the recess 19a. Further, the projections 19b may be formed on the upper surface of the top portion 14 of the tray 10A, and the recesses 19a may be formed on the lower surface of the bottom portion 11 of the tray 10A. Further, the restriction means for restricting the movement of the upper tray 10A in the condition where the upper tray 10A is stacked on the upper surface of the top portion 14 of the lower tray 10A is not limited to the recesses 19a and the projections 19b mentioned above. For example, a vertical wall may be formed on the top portion 14 of each tray 10A in such a manner that the bottom portion 11 of each tray 10A can be accommodated inside the vertical wall. Accordingly, the movement of the upper tray 10A in the condition where the upper tray 10A is stacked on the upper surface of the top portion 14 of the lower tray 10A can be restricted by the vertical wall of the top portion 14 of the lower tray 10A.

Figure 8:
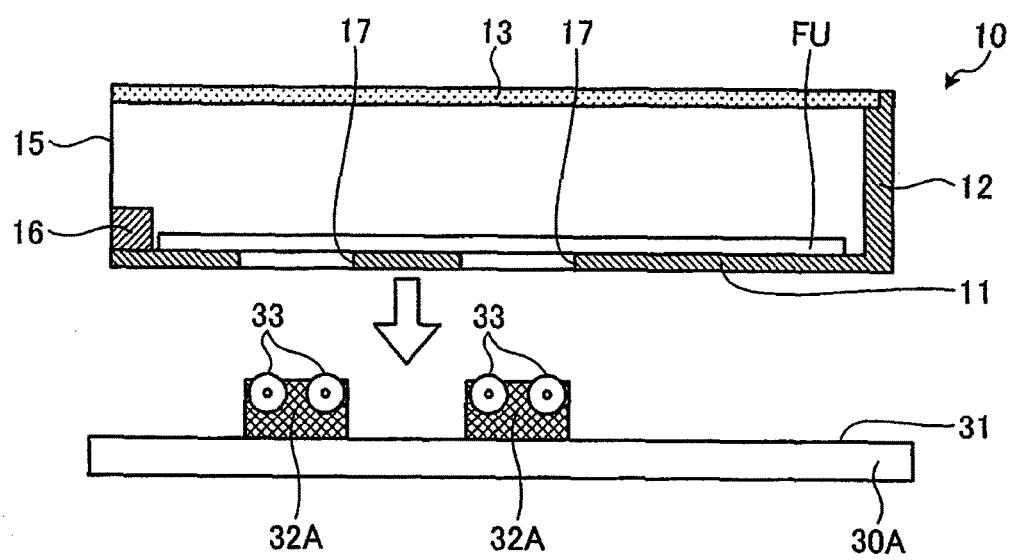
FIG. 8 is a sectional view depicting a manner of setting the tray on a tray support member according to another modification.
Figure 9:
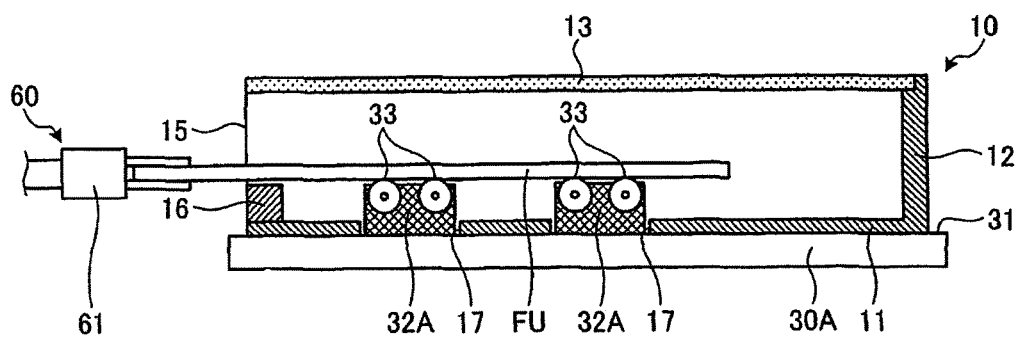
FIG. 9 is a sectional view depicting a manner of taking the frame unit out of the tray supported on the tray support member depicted in FIG. 8 or storing the frame unit into the tray.

FIG. 8 is a sectional view depicting a manner of setting the tray 10 on a tray support member 30A according to another modification, and FIG. 9 is a sectional view depicting a manner of taking the frame unit FU out of the tray 10 supported on the tray support member 30A or storing the frame unit FU into the tray 10 supported on the tray support member 30A. As depicted in FIGS. 8 and 9, the tray support member 30A according to this modification has a plurality of pushing members 32A in place of the plural pushing members 32 depicted in FIG. 3.

Each pushing member 32A has a housing and a plurality of roller units 33 rotatably supported in the housing. Each roller unit 33 is partially exposed to the upper surface of the housing of each pushing member 32A. Accordingly, when the grip arm 61 of the frame unit handling mechanism 60 is operated to grip the frame unit FU and then move the frame unit FU in such a manner that the frame unit FU slides on the upper surface of each pushing member 32A as depicted in FIG. 9, the frame unit FU can be smoothly moved by the rotation of the roller units 33. In place of the roller units 33, the upper surface of each pushing member 32 may be treated with a fluororesin coating, for example, thereby reducing the surface roughness of each pushing member 32. Also in this case, the frame unit FU can be smoothly moved on the upper surface of each pushing member 32.

While the first and second processing apparatuses 101 and 102 are each a cutting apparatus and the third processing apparatus 103 is a die bonder in the above preferred embodiment, the first, second, and third processing apparatuses 101, 102, and 103 are not limited. For example, the first and second processing apparatuses 101 and 102 may be any apparatuses for forming grooves on the wafer W along the division lines L by using laser ablation or plasma etching and for dividing the wafer W along the division lines L where the grooves have been formed. Further, the second processing apparatus 102 may be a polishing apparatus for polishing the back side of the wafer W until the bottom of each groove formed on the front side of the wafer W by the first processing apparatus 101 is exposed to the back side of the wafer W, thereby dividing the wafer W into a plurality of device chips. Further, the first processing apparatus 101 may be an apparatus for forming modified layers inside the wafer W along the division lines L by applying a laser beam to the wafer W along the division lines L. In this case, the second processing apparatus 102 may be an apparatus for dividing the wafer W into a plurality of device chips along the modified layers formed in the wafer W by the first processing apparatus 101, by applying an external force to the wafer W. The third processing apparatus 103 may be an apparatus for picking up the plural device chips divided from the wafer W by the first and second processing apparatuses 101 and 102, from the adhesive tape T or an apparatus for cleaning the plural device chips.

In the case that the adhesive tape T of the frame unit FU is an ultraviolet curing type adhesive tape, an ultraviolet light applying apparatus capable of applying ultraviolet light to the frame unit FU stored in the tray 10 from the lower side thereof may be provided at any position on the path of movement of the conveyor 20. In this case, by applying ultraviolet light from the ultraviolet light applying apparatus to the frame unit FU, the adhesive tape T of the frame unit FU can be cured to be reduced in adhesion. As a result, after dividing the wafer W, the plural device chips can be easily picked up from the adhesive tape T.

In the above preferred embodiment, the pushing members 32 of the tray support member 30 are inserted through the openings 17 of the tray 10 to enter the tray 10 and push up the frame unit FU to the vertical position higher than the height of the abutting member 16. In this condition, the frame unit FU is passed through the inlet/outlet opening 15 of the tray 10. However, means for passing the frame unit FU through the inlet/outlet opening 15 of the tray 10 is not limited to the above. For example, the pushing members 32 may be omitted from the tray support member 30, and the openings 17 may be omitted from the tray 10. In this case, the grip arm 61 of the frame unit handling mechanism 60 is operated to grip the frame unit FU mounted on the mounting surface 11a of the tray 10, and the grip arm 61 is moved vertically upward to thereby raise the frame unit FU to the vertical position higher than the height of the abutting member 16. In this case, the tray support member 30 and the tray transfer member 40 may not be used, but the frame unit handling mechanism 60 may be used to directly transfer the frame unit FU from the tray 10 on the conveyor 20 to the processing apparatuses 101, 102, and 103.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A frame unit transfer system for transferring a frame unit formed by supporting a workpiece through an adhesive tape to an annular frame having an inside opening in a condition where said workpiece is positioned in said inside opening of said annular frame, said frame unit transfer system comprising:
    a tray for storing said frame unit in transferring said frame unit;
    a conveyor for moving said tray storing said frame unit;
    a tray support member provided adjacent to said conveyor for supporting said tray; and
    a tray transfer member for transferring said tray between said conveyor and said tray support member;
    said tray including
    a bottom portion having a mounting surface for mounting said frame unit thereon during transfer;
    a side wall standing from the outer edge of said bottom portion,
    an inlet/outlet opening formed through said side wall so as to allow the pass of said frame unit,
    an abutting member provided on said bottom portion at said inlet/outlet opening for preventing said frame unit mounted on said mounting surface of said bottom portion from undesirably projecting from said inlet/outlet opening during transfer, and
    a plurality of openings formed at predetermined target positions in said bottom portion in relation to said frame unit,
    said tray support member having a plurality of pushing members adapted to be inserted through said plurality of openings of said bottom portion of said tray,
    wherein when said pushing members are inserted through said openings to enter said tray storing said frame unit, said frame unit mounted on said mounting surface of said bottom portion of said tray is pushed up by said pushing members to a vertical position higher than the height of said abutting member, so that said frame unit raised at said vertical position can be passed through said inlet/outlet opening.

2. The frame unit transfer system according to claim 1, wherein said tray further includes a top portion opposed to said bottom portion to thereby define a storing space for storing said frame unit;
    said top portion having restriction means for restricting the movement of another tray stacked on the upper surface of said top portion of said tray.

* * * * *